United States Patent

Noguchi et al.

[11] Patent Number: 5,227,650
[45] Date of Patent: Jul. 13, 1993

[54] CHARGE COUPLED DEVICE DELAY LINE EMPLOYING A FLOATING GATE OR FLOATING DIFFUSION GATE AT ITS INTERMEDIATE OUTPUT PORTION

[75] Inventors: Katsunori Noguchi; Maki Sato; Tadakuni Narabu; Yasuhito Maki, all of Kanagawa, Japan

[73] Assignee: Sony Corporation, Tokyo, Japan

[21] Appl. No.: 824,355

[22] Filed: Jan. 23, 1992

[30] Foreign Application Priority Data

Jan. 23, 1991 [JP] Japan .................. 3-023951

[51] Int. Cl.[5] .................. H01L 29/78; H01L 27/02
[52] U.S. Cl. .................. 257/239; 257/221; 257/236
[58] Field of Search .................. 357/24, 24 M; 377/60, 377/61, 62, 63; 257/221, 236, 239

[56] References Cited

U.S. PATENT DOCUMENTS 4,513,431  4/1985  Chamberlain et al. .......... 357/24 M
4,594,604  6/1986  Kub .................. 357/24 M Primary Examiner—Andrew J. James
Assistant Examiner—Ngan Van Ngo
Attorney, Agent, or Firm—Hill, Steadman & Simpson

[57] ABSTRACT

The present invention is to provide a CCD delay line in which a deterioration of a charge transfer efficiency can be reduced by maintaining a charge amount treated in a charge transfer section provided at the rear stage of an intermediate output section. According to an aspect of the present invention, in a charge transfer device having charge transfer sections of a plurality of stages consisting of electrode pairs of a transfer gate electrode and a storage gate electrode and at least one intermediate output section provided at the rear stage of a charge transfer section of a predetermined stage from the signal input side, a cross-sectional area of at least one of the transfer gate electrode and the storage gate electrode in the charge transfer section provided at the rear stage of the intermediate output section is selected to be larger than that in the charge transfer section provided at the front stage of the intermediate output section. Further, the impurity concentration in the region of a semiconductor substrate corresponding to the transfer gate electrode in the charge transfer section provided at the rear stage of the intermediate output section is selected to be lower than that in the charge transfer section provided at the front stage of the intermediate output section, thereby the potential barrier being increased.

6 Claims, 4 Drawing Sheets

CHARGE COUPLED DEVICE DELAY LINE EMPLOYING A FLOATING GATE OR FLOATING DIFFUSION GATE AT ITS INTERMEDIATE OUTPUT PORTION

BACKGROUND OF THE INVENTION

1. Field of the Invention

The present invention generally relates to CCD (charge coupled device) delay lines and, more particularly, is directed to a CCD delay line which employs a floating gate (FG) or a floating diffusion gate at its intermediate output portion.

2. Description of the Prior Art

CCD delay lines are devices which make effective use of charge transfer and/or time operation function to delay or vary a signal from a timing standpoint, thereby processing a signal. The CCD delay line is different from a CCD image pickup element in that signal charges are calculated by an input signal voltage and injected while signal charges are generated and injected by the incidence of light according to the CCD image pickup element. A delay time (delay amount) Td of this CCD delay line is calculated by the following equation:

$$Td = N \times 1/fc$$

where N is the number of transfer stages and fc the sampling frequency.

In the case of the device in which the transfer stage N is 680 [bit] and the sampling frequency fc is 10.73 [MHz], the delay time Td thereof is expressed as:

$$Td = 680 \times 1/(10.73 \times 10^6) = 63.4 \ [\mu sec]$$

This delay time Td becomes substantially equal to the horizontal synchronizing frequency of a television signal. Further, if the sampling frequency fc is variable, then the delay time Td also becomes variable so that the signal can be compressed and/or expanded from a time base standpoint.

FIG. 1 is a cross-sectional view illustrating an example of a structure of a CCD delay line employing floating gate (FG) according to the prior art.

As shown in FIG. 1, a plurality of stages (n stages) of charge transfer units $3_n$, each formed of an electrode pair of a storage gate electrode 4 and a transfer gate electrode 5 are sequentially arrayed and at least one intermediate output portion 7 for deriving a signal of a predetermined delay time is provided to the rear stage of, for example, a (k−1)'th stage of an electric charge transfer section $3_{k-1}$ from the signal input side. In this case, regardless of the front and/or rear stage of the intermediate output portion 7, channel lengths and channel widths of the storage gate electrode 4 and the transfer gate electrode 5 are set to be the same. Further, the channel lengths of the storage gate electrode 4 and the transfer gate electrode 5 tend to be reduced as the CCD delay line becomes more and more densified.

However, if the channel lengths of the storage gate electrode 4 and the transfer gate electrode 5 of each of the charge transfer sections 3 are reduced as the CCD delay line becomes more and more densified, then when a potential becomes deep in the storage state of the intermediate output section 7 as shown by a solid line in FIG. 2, a potential barrier beneath the transfer electrode 5 in a charge transfer section $3_k$ provided at the rear stage of the intermediate output portion 7 is affected in a three-dimensional fashion. As a consequence, an original potential shown by a one-dot chain line in FIG. 2 is changed as shown by the solid line so that a sufficient potential for transferring and storing all electric charges from the intermediate output section 7 cannot be secured.

In other words, while the CCD delay line is made more and more densified by reducing the channel lengths of the storage gate electrode 4 and the transfer gate electrode 5 of each of the charge transfer sections 3, the potential barrier under the transfer gate electrode 5 in the charge transfer section $3_k$ provided at the rear stage of the intermediate output section 7 is changed by the influence of the potential at the front stage of the intermediate output section 7 so that the amount of the electric charges treated in the charge transfer section $3_k$ provided at the rear stage of the intermediate output section 7 is reduced, thereby deteriorating the charge transfer efficiency.

OBJECTS AND SUMMARY OF THE INVENTION

Therefore, it is an object of the present invention to provide an improved CCD delay line in which the aforesaid shortcomings and disadvantages encountered with the prior art can be eliminated.

More specifically, it is an object of the present invention to provide a CCD delay line in which an amount of charges treated in a charge transfer section provided at the rear stage of an intermediate output section is secured to thereby prevent a charge transfer efficiency from being deteriorated As an aspect of the present invention, in a charge transfer device having charge transfer sections of a plurality of stages, each consisting of an electrode pair of a transfer gate electrode and a storage gate electrode and at least one intermediate output section provided at the rear stage of the charge transfer section of the predetermined stage from the signal input side, at least one of the cross-sectional areas of the transfer gate electrode and the storage gate electrode in the charge transfer section provided at the rear stage of the intermediate output section is selected to be larger than that in the charge transfer section provided at the front stage of the intermediate output section.

In accordance with another aspect of the present invention, the impurity concentration of the region of the semiconductor substrate opposing to the transfer gate electrode in the charge transfer section provided at the rear stage of the intermediate output section is selected to be lower than that in the charge transfer section provided at the front stage of the intermediate output section, thereby to make the potential barrier higher.

Therefore, according to the CCD delay line of the present invention, even if the potential barrier under the transfer gate electrode in the charge transfer section provided at the rear stage of the intermediate output section is affected, for example, in a three-dimensional fashion when the potential becomes deep in the storage state of the intermediate output section, the cross-sectional area of the transfer gate electrode in the charge transfer section provided at the rear stage of the intermediate output section is large so that the potential barrier sufficient for transferring and storing all charges from the intermediate output section can be secured. Further, even if the potential barrier is changed, the cross-sectional area of the storage gate electrode in the charge transfer section provided at the rear stage of the intermediate output section is large so that the maximum charge amount treated in the charge transfer section provided at the rear stage of the intermediate output section can be secured. Furthermore, since the impurity concentration in the region of the semiconductor substrate corresponding to the transfer gate electrode in the charge transfer section provided at the rear stage of the intermediate output section is selected to be lower than that in the charge transfer section provided at the front stage of the intermediate output section so as to increase the potential barrier, the maximum charge amount treated in the charge transfer section provided at the rear stage of the intermediate output section can be increased. Therefore, in any case, the charge transfer efficiency can be prevented from being deteriorated as the CCD delay line becomes more and more densified.

The preceding and other objects, features and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

The present invention will hereinafter be described in detail with reference to the accompanying drawings.

Figure 1:
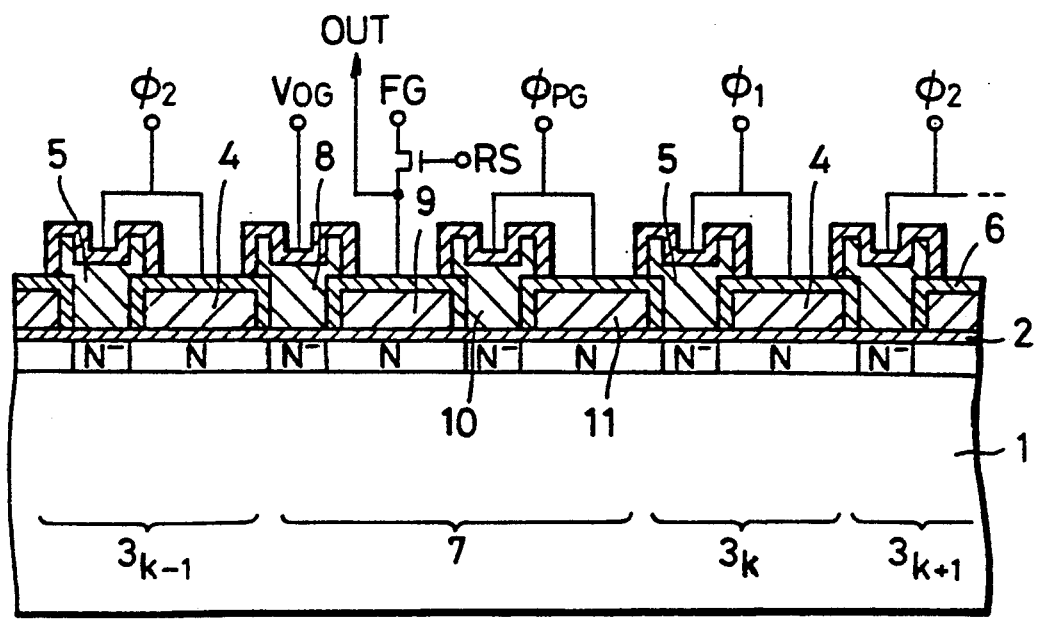
FIG. 1 is a cross-sectional view illustrating an example of a CCD delay line according to the prior art.
Figure 2:
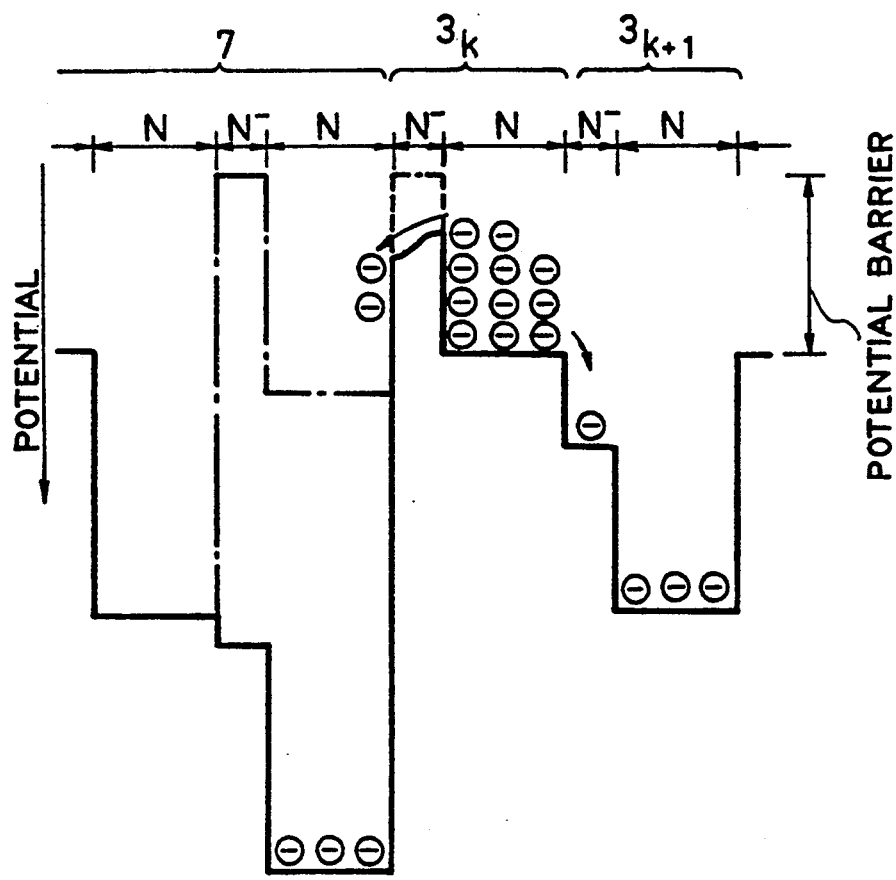
FIG. 2 is a potential diagram of an intermediate output section and to which references will be made in explaining the example shown in FIG. 1.
Figure 3:
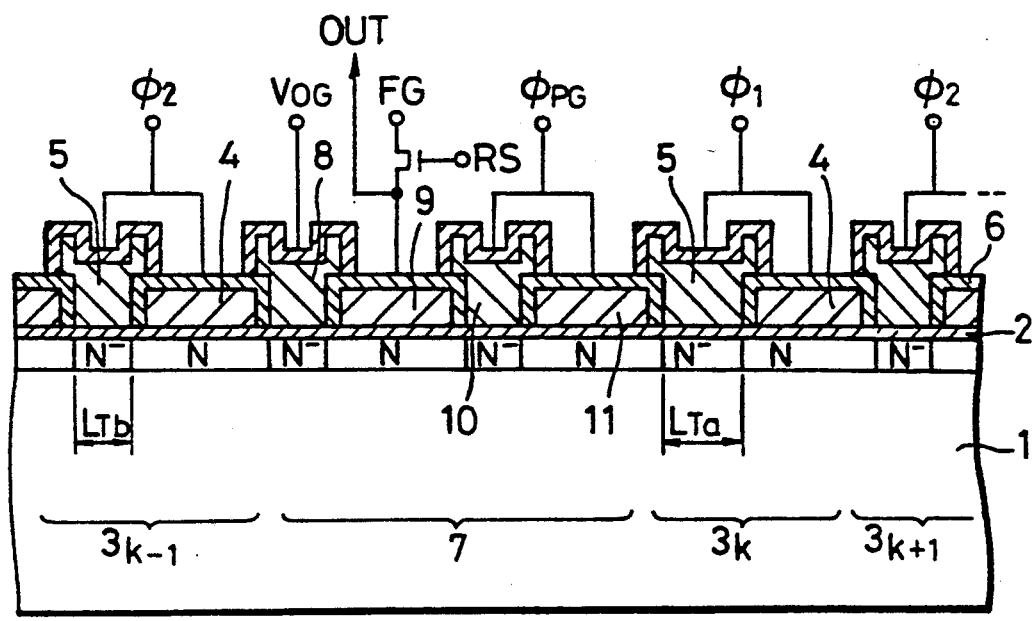
FIG. 3 is a cross-sectional view illustrating an embodiment of a CCD delay line according to the present invention.
Figure 4:
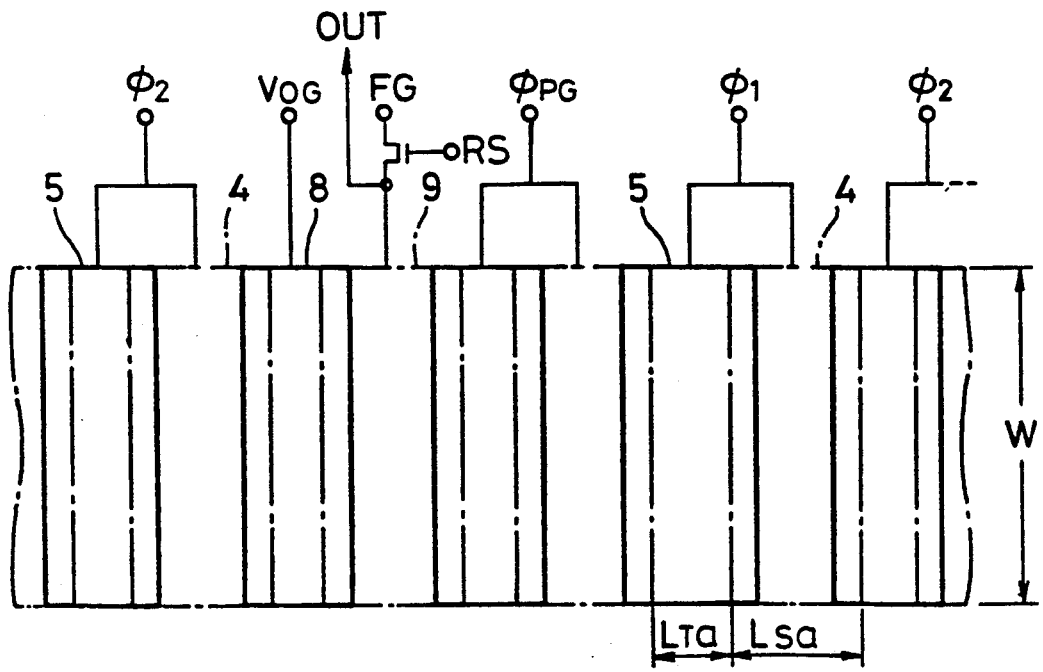
FIG. 4 is a plan view illustrating the embodiment of the CCD delay line according to the present invention.

FIG. 3 is a cross-sectional view illustrating a structure of a CCD delay line to which the embodiment of the present invention is applied. FIG. 4 is a plan view thereof.

As illustrated, charge transfer sections 3 ($3_1, \ldots, 3_k, \ldots, 3_n$) of n stages are sequentially arrayed, for example, on a silicon semiconductor substrate 1 through an insulating layer 2 made of a silicon oxide layer $SiO_2$ in the transfer direction. Each of the charge transfer sections 3 is formed as a bi-layer structure consisting of an electrode pair of a storage gate electrode 4 made of a first polysilicon layer and a transfer gate electrode 5 made of a second polysilicon layer. The electrode pair of the storage gate electrode 4 and the transfer gate electrode 5 are covered with an insulating layer 6 made of a silicon oxide layer $SiO_2$ and are thereby insulated from the adjacent electrode pair. These charge transfer sections 3 are applied with two-phase transfer clocks $\phi_1$ and $\phi_2$ at every other pair.

Figure 5:
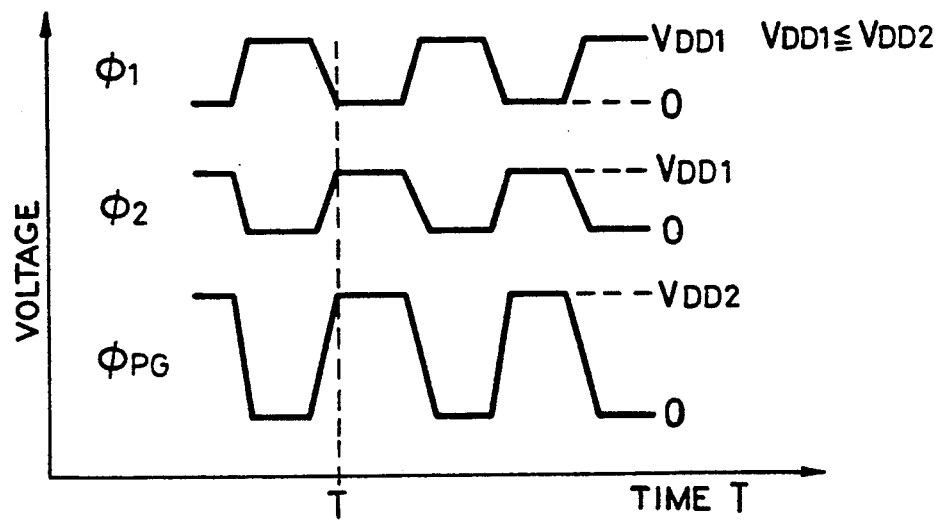
FIG. 5 is a timing waveform diagram used to explain operation of the present invention.

At the rear stage of a charge transfer section $3_{k-1}$ of a predetermined stage ((k−1)'th stage in this embodiment) from the signal input side, an intermediate output section 7 is provided to derive a signal whose delay time is determined by the number of stages. The intermediate output section 7 is comprised of an output gate (OG) electrode 8, a floating gate (FG) electrode 9 and a transfer gate electrode 10 and a storage gate electrode 11 constructing a precharge gate (PG) section. A signal charge stored in the floating gate (FG) is delivered as a signal output OUT which is delayed by a delay time corresponding to the present stage number k−1. The transfer gate electrode 10 and the storage gate electrode 11 forming the precharge gate section are applied with a precharge clock $\phi_{pg}$ in a timing relation relative to the transfer clocks $\phi_1, \phi_2$ as shown in FIG. 5. A peak value $V_{DD2}$ of the precharge clock $\phi_{PG}$ is set to be higher than a peak value $V_{DD1}$ of the transfer clocks $\phi_1$ and $\phi_2$. N type regions are formed on the surface side of the silicon semiconductor substrate 1 in an opposing relation to the respective storage gate electrodes 4, 9, 11 and N- type regions also are formed thereon in an opposing relation to the respective transfer gate electrodes 5, 8, 10, respectively.

In the CCD delay line thus arranged, one of the most specific features of this embodiment lies in that a channel length $L_{Ta}$ of the transfer gate electrode 5 of the charge transfer section $3_k$ formed at the rear stage of the intermediate output section 7 is set to be longer than a channel length $L_{Tb}$ of the transfer gate electrode 5 of the charge transfer section $3_{k-1}$ formed at the front stage of the intermediate output section 7.

Figure 6:
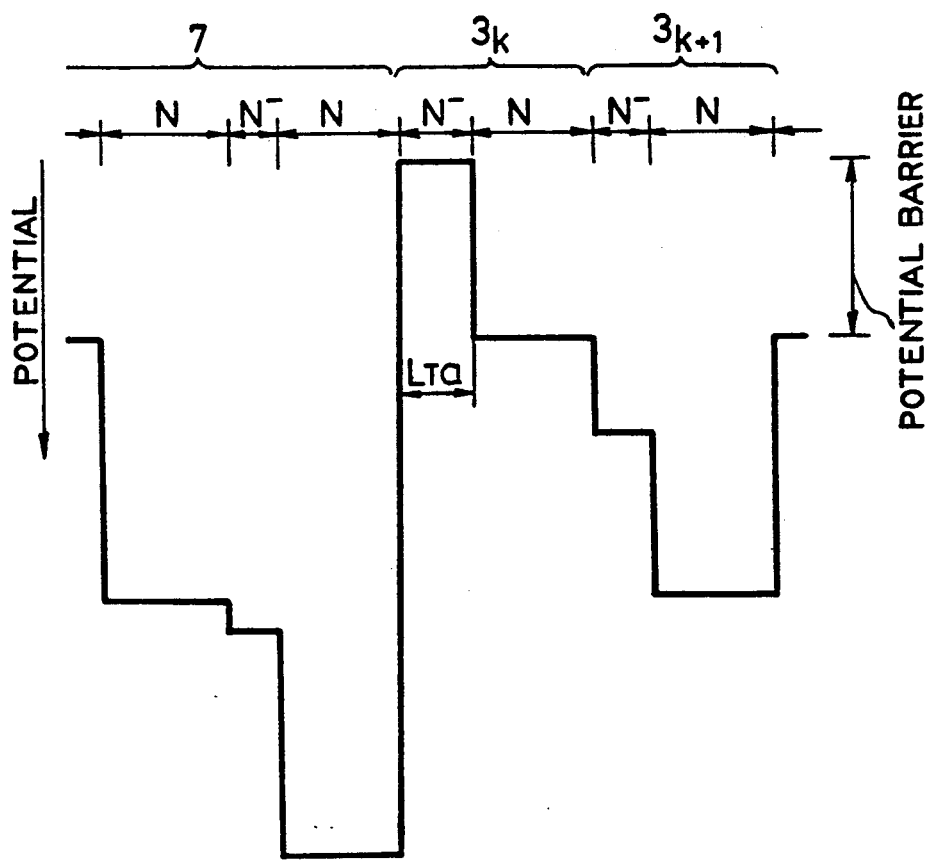
FIG. 6 is a potential diagram of an intermediate output unit and to which references will be made in explaining operation of the present invention.

According to the above-mentioned arrangement, in a schematic diagram of FIG. 6 showing potential of the intermediate output section 7 at a time T in FIG. 5, even if a potential barrier under the transfer gate electrode 5 in the charge transfer section $3_k$ formed at the rear stage of the intermediate output section 7 is affected in a three-dimensional fashion when the potential becomes deep in the storage state of the intermediate output section 7, a potential barrier sufficient for transferring and storing all electric charges from the intermediate output section 7 can be secured. Accordingly, since the electric charge amount treated in the charge transfer section $3_k$ formed at the rear stage of the intermediate output section 7 can be secured, the CCD delay line can be densified without deteriorating the charge transfer efficiency by reducing the channel lengths of the storage gate electrodes 4 and the transfer gate electrodes 5 of the charge transfer section other than the charge transfer section $3_k$ formed at the rear stage of the intermediate output section 7.

Figure 7:
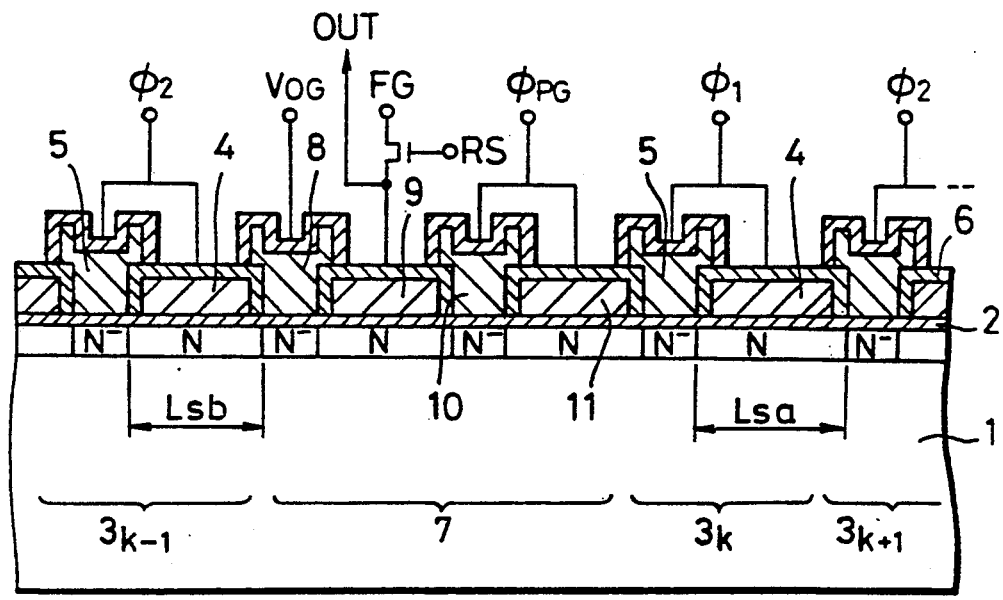
FIG. 7 is a cross-sectional view illustrating another embodiment of the CCD delay line according to the present invention.

FIG. 7 is a cross-sectional view illustrating a structure of the CCD delay line according to another embodiment of the present invention. In FIG. 7, like parts corresponding to those of FIG. 3 are marked with the same references and therefore need not be described.

One of the most specific features of the second embodiment of the invention lies in that a channel length $L_{Sa}$ of the storage gate electrode 4 in the charge transfer section $3_k$ formed at the rear stage of the intermediate output section 7 is set to be longer than a channel length $L_{Sb}$ of the storage gate electrode 4 in the charge transfer section $3_{k-1}$ formed at the front stage of the intermediate output section 7.

Figure 8:
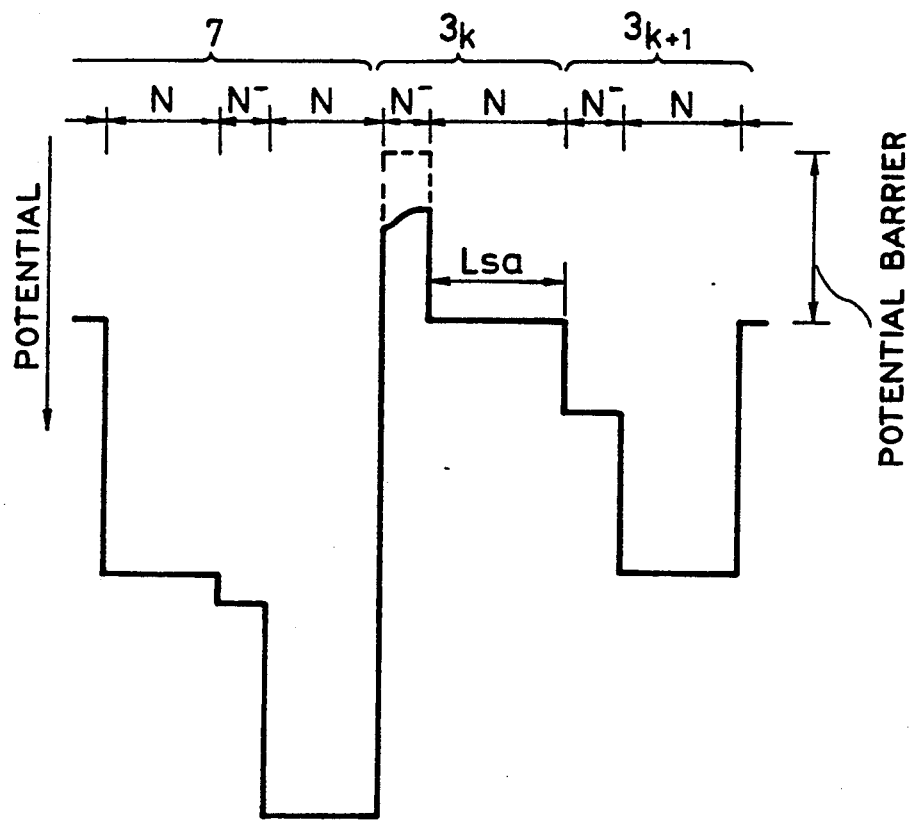
FIG. 8 is a potential diagram used to explain operation of the CCD delay line shown in FIG. 7.

According to this arrangement, in a schematic diagram of FIG. 8 showing a potential of the intermediate output section 7 at the time T in FIG. 5, the potential barrier under the transfer gate electrode 5 in the charge transfer section $3_k$ formed at the rear stage of the intermediate output section 7 is affected in a three-dimensional fashion when the potential becomes deep in the storage state of the intermediate output section 7 so that, even if the original potential shown by a phantom in FIG. 8 is changed as shown by a solid line in FIG. 8, the maximum electric charge amount treated in the storage gate electrode 4 of the charge transfer section $3_k$ is larger as compared with others because the channel length $L_{Sa}$ of the storage gate electrode 4 in the charge transfer section $3_k$ is longer. Therefore, the CCD delay line can be densified without deteriorating the charge transfer efficiency by reducing the channel lengths of the storage gate electrodes 4 and the transfer gate electrodes 5 in the charge transfer section other than the charge transfer section $3_k$ provided at the rear stage of the intermediate output section 7.

While one of the channel lengths of the storage gate electrode 4 and the transfer gate electrode 5 in the charge transfer section $3_k$ provided at the rear stage of the intermediate output section 7 is made longer than that of the charge transfer section $3_{k-1}$ provided at the front stage of the intermediate output section 7 as described above in the first and second embodiments, the channel length to be reduced is not limited to one of those of the storage gate electrode 4 and the transfer gate electrode 5 and both of the channel lengths of the storage gate electrode 4 and the transfer gate electrode 5 may be set to be similar, which can be expected to achieve great effects as compared with the case such that one of the channel lengths is set to be longer than another.

While the present invention is applied to the CCD delay line in which the floating gate is employed in the intermediate output section as described above in the first and second embodiments, the present invention is not limited thereto and can also be applied to a CCD delay line in which a floating diffusion gate is employed as the intermediate output section.

Further, while the channel length $L_{Ta}$ or $L_{Sa}$ each of the gate electrodes in the charge transfer section $3_k$ provided at the rear stage of the intermediate output section 7 is set to be longer than that of each of gate electrodes in the charge transfer section $3_{k-1}$ provided at the front stage of the intermediate output section 7 as described above in the first and second embodiments, the present invention is not limited to the length of the channel length $L_{Ta}$ or $L_{Sa}$ and such a variant also is possible that a width W (see FIG. 4) in the quadrature direction with respect to the charge transfer direction is set to be larger. In short, it is sufficient that the maximum charge amount treated in the charge transfer section $3_k$ provided at the rear stage of the intermediate output section 7 may be increased by increasing a cross-sectional area of each of the channels.

Alternatively, it is sufficient that the impurity concentration of the N- region in the silicon semiconductor substrate 1 corresponding to the transfer gate electrode 5 in the charge transfer section $3_k$ provided at the rear stage of the intermediate output section 7 is selected to be lower than that in the charge transfer section $3_{k-1}$ provided at the front stage of the intermediate output section 7, thereby the potential barrier being made higher. Thus, the maximum charge amount treated in the charge transfer section $3_k$ can be increased.

As set out above, according to the CCD delay line of the present invention, since at least one of the cross-sectional areas of the transfer gate electrode and the storage gate electrode in the charge transfer section provided at the rear stage of the intermediate output section is large than that in the charge transfer section provided at the front stage of the intermediate output section, the charge amount treated in the charge transfer section provided at the rear stage of the intermediate output section can be secured, thus making it possible to make the CCD delay line densified without deteriorating the charge transfer efficiency.

Further, since the charge amount treated in the charge transfer section provided at the rear stage of the intermediate output section can be secured also in the case such that the impurity concentration of the region on the semiconductor substrate corresponding to the transfer gate electrode in the charge transfer section provided at the rear stage of the intermediate output section is selected lower than that in the charge transfer section at the front stage of the intermediate output section, the CCD delay line can be densified without deteriorating the charge transfer efficiency.

Having described the preferred embodiments of the invention with reference to the accompanying drawings, it is to be understood that the present invention is not limited to those precise embodiments and that various changes and modification thereof could be effected by one skilled in the art without departing from the spirit or scope of the novel concepts of the invention as defined in the appended claims.

What is claimed is:

1. A CCD delay line comprising:
   (a) a first set of charge transfer section consisting of a plurality of transfer electrodes and a plurality of storage electrodes provided on a CCD channel region through an insulating layer, in which a pair of transfer electrode and storage electrode form one delay stage;
   (b) a second set of charge transfer section consisting of a plurality of transfer electrodes and a plurality of storage electrodes provided on said CCD channel region through said insulating layer, in which a pair of transfer electrode and storage electrode form another delay stage; and
   (c) an intermediate output means provided between said first and second sets of charge transfer sections, wherein the cross-sectional area of one of the last pair of transfer electrode and storage electrode of said first set of charge transfer section is smaller than that of the same one of the first pair of transfer electrode and storage electrode of said second set of charge transfer section.

2. A CCD delay line according to claim 1, in which the width in the charge transfer direction of one of the last pair of transfer electrode and storage electrode of said first set of charge transfer section is smaller than that of the same one of the first pair of transfer electrode and storage electrode of said second set of charge transfer section.

3. A CCD delay line according to claim 1, in which the width in quadrature direction with respect to the charge transfer direction of one of the last pair of transfer electrode and storage electrode of said first set of charge transfer section is smaller than that of the same one of the first pair of transfer electrode and storage electrode of said second set of charge transfer section.

4. A CCD delay line comprising:
(1) a first set of charge transfer section consisting of a plurality of transfer electrodes and a plurality of storage electrodes provided on a CCD channel region through an insulating layer, in which a pair of transfer electrode and storage electrode form one delay stage;
(2) a second set of charge transfer section consisting of a plurality of transfer electrodes and a plurality of storage electrodes provided on said CCD channel region through said insulating layer, in which a pair of transfer electrode and storage electrode form another delay stage; and
(3) an intermediate output means provided between said first and second sets of charge transfer sections, wherein the impurity concentration of the CCD channel region corresponding to one of the last pair of transfer electrode and storage electrode of said first set of charge transfer section is higher than that of the same one of the first pair of transfer electrode and storage electrode of said second set of charge transfer section.

5. A CCD delay line according to claim 1 or 2, in which said intermediate output means is formed in a floating-gate type.

6. A CCD delay line according to claim 1 or 2, in which said intermediate output means if formed in a floating-diffusion type.

* * * * *